(12) United States Patent
Mazzilli

(10) Patent No.: US 8,860,259 B1
(45) Date of Patent: Oct. 14, 2014

(54) AUXILIARY ELECTRICAL POWER SYSTEM

(76) Inventor: Brian Mazzilli, Plymouth, MA (US)

( * ) Notice: Subject to any disclaimer, the term of this patent is extended or adjusted under 35 U.S.C. 154(b) by 788 days.

(21) Appl. No.: 12/949,487

(22) Filed: Nov. 18, 2010

(51) Int. Cl.
*H02J 9/00* (2006.01)
*H02J 7/00* (2006.01)
*H02B 1/00* (2006.01)
*H05K 7/00* (2006.01)

(52) U.S. Cl.
USPC ............... 307/150; 307/64; 307/66; 361/600; 361/837

(58) Field of Classification Search
None
See application file for complete search history.

(56) References Cited

U.S. PATENT DOCUMENTS

| | | | |
|---|---|---|---|
| 4,300,087 A | 11/1981 | Meisner | |
| D300,920 S | 5/1989 | Gierke | |
| 5,224,239 A * | 7/1993 | Cuthbert, Jr. | 15/347 |
| 5,689,412 A | 11/1997 | Chen | |
| 5,737,189 A * | 4/1998 | Kammersgard et al. | 361/726 |
| 6,169,384 B1 | 1/2001 | Shannon | |
| D542,221 S * | 5/2007 | Hriscu et al. | D13/110 |
| 7,247,954 B1 * | 7/2007 | Dowdle | 307/150 |
| 7,583,054 B1 | 9/2009 | Harris | |
| 2005/0088866 A1 * | 4/2005 | Levine | 363/146 |
| 2007/0033740 A1 * | 2/2007 | Dehner | 7/158 |
| 2008/0063936 A1 | 3/2008 | Hansen | |
| 2008/0137386 A1 * | 6/2008 | Jitaru et al. | 363/146 |
| 2012/0081067 A1 * | 4/2012 | Burrell, IV | 320/107 |

* cited by examiner

*Primary Examiner* — Jared Fureman
*Assistant Examiner* — Aqeel Bukhari

(57) ABSTRACT

An auxiliary electrical power system includes a housing that has a top wall, a bottom wall and a perimeter wall attached to and extends between the top and bottom walls. A battery for storing an electric charge is mounted within the housing. An inverter is mounted within the housing and is electrically coupled to the battery. A power cord is electrically coupled to the inverter and extends through the housing. The power cord has a distal end with respect to the housing. The distal end comprises a female plug configured to supply electricity to an electrically powered device from the battery when the electrically powered device is plugged into the female plug.

7 Claims, 4 Drawing Sheets

AUXILIARY ELECTRICAL POWER SYSTEM

BACKGROUND OF THE DISCLOSURE

Field of the Disclosure

The disclosure relates to auxiliary power devices and more particularly pertains to a new auxiliary power device for supplying electrical power to an electrically powered device during a power outage or where electricity is not available.

SUMMARY OF THE DISCLOSURE

An embodiment of the disclosure meets the needs presented above by generally comprising a housing that has a top wall, a bottom wall and a perimeter wall attached to and extends between the top and bottom walls. A battery for storing an electric charge is mounted within the housing. An inverter is mounted within the housing and is electrically coupled to the battery. A power cord is electrically coupled to the inverter and extends through the housing. The power cord has a distal end with respect to the housing. The distal end comprises a female plug configured to supply electricity to an electrically powered device from the battery when the electrically powered device is plugged into the female plug.

There has thus been outlined, rather broadly, the more important features of the disclosure in order that the detailed description thereof that follows may be better understood, and in order that the present contribution to the art may be better appreciated. There are additional features of the disclosure that will be described hereinafter and which will form the subject matter of the claims appended hereto.

The objects of the disclosure, along with the various features of novelty which characterize the disclosure, are pointed out with particularity in the claims annexed to and forming a part of this disclosure.

BRIEF DESCRIPTION OF THE DRAWINGS

The disclosure will be better understood and objects other than those set forth above will become apparent when consideration is given to the following detailed description thereof. Such description makes reference to the annexed drawings wherein.

DESCRIPTION OF THE PREFERRED EMBODIMENT

Figure 1:
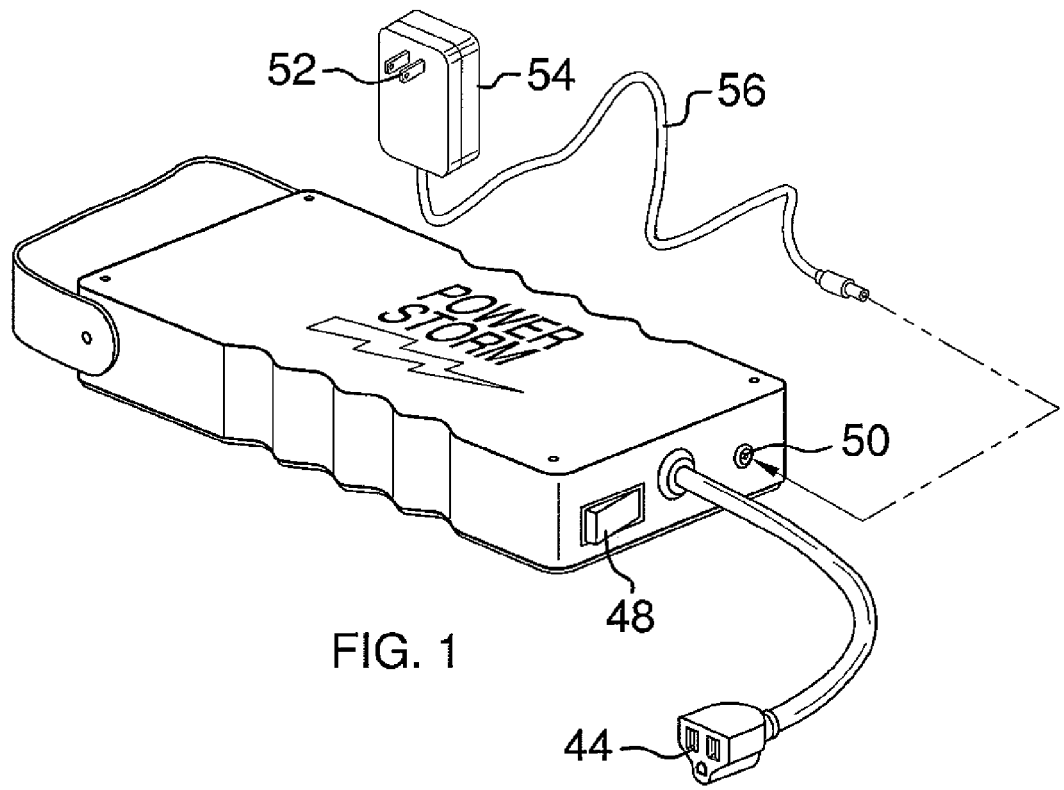
FIG. 1 is a top perspective view of an auxiliary electrical power system according to an embodiment of the disclosure.
Figure 2:
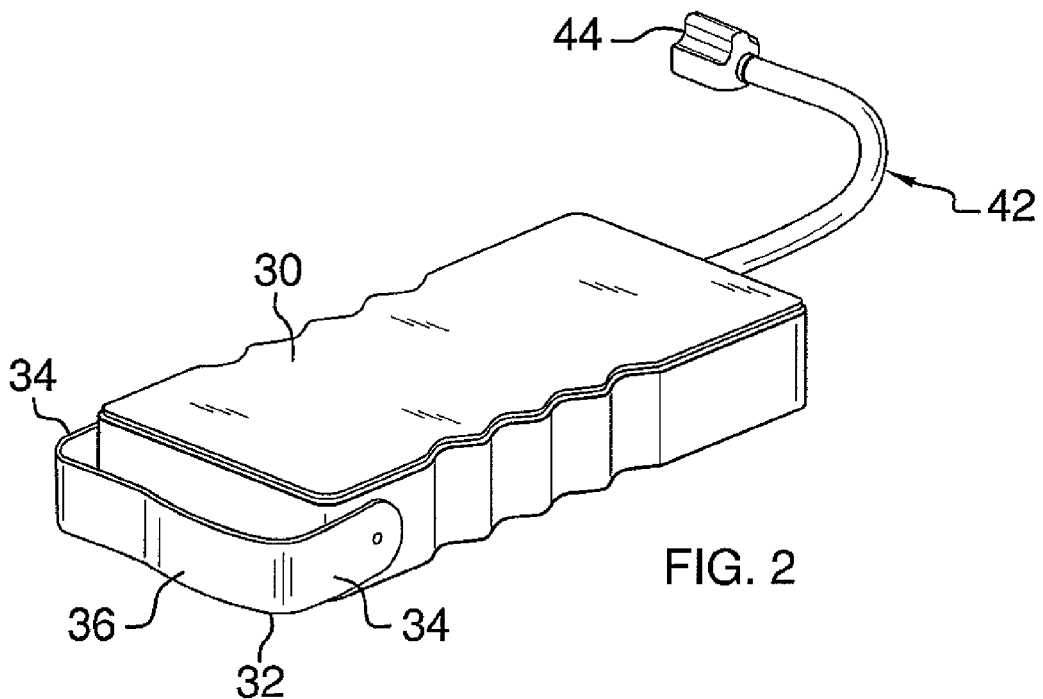
FIG. 2 is a bottom perspective view of an embodiment of the disclosure.
Figure 3:
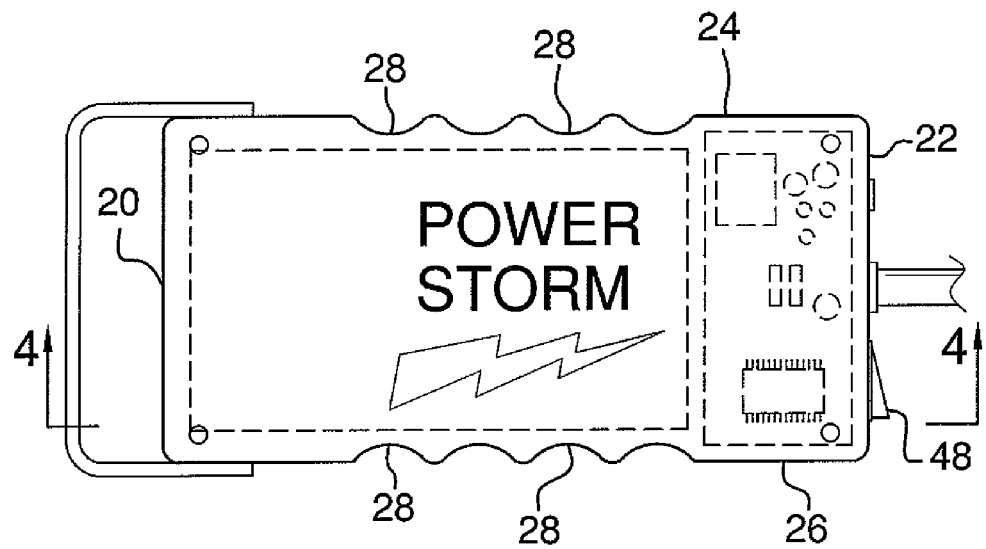
FIG. 3 is a top view of an embodiment of the disclosure.
Figure 4:
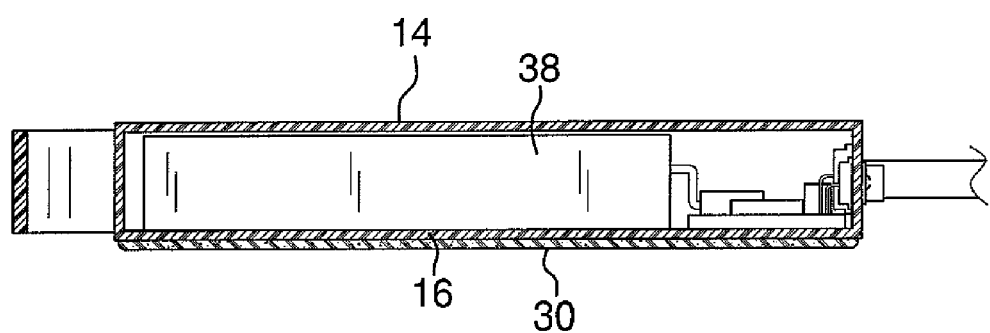
FIG. 4 is a cross-sectional view of an embodiment of the disclosure taken along line 4-4 of FIG. 3.
Figure 5:
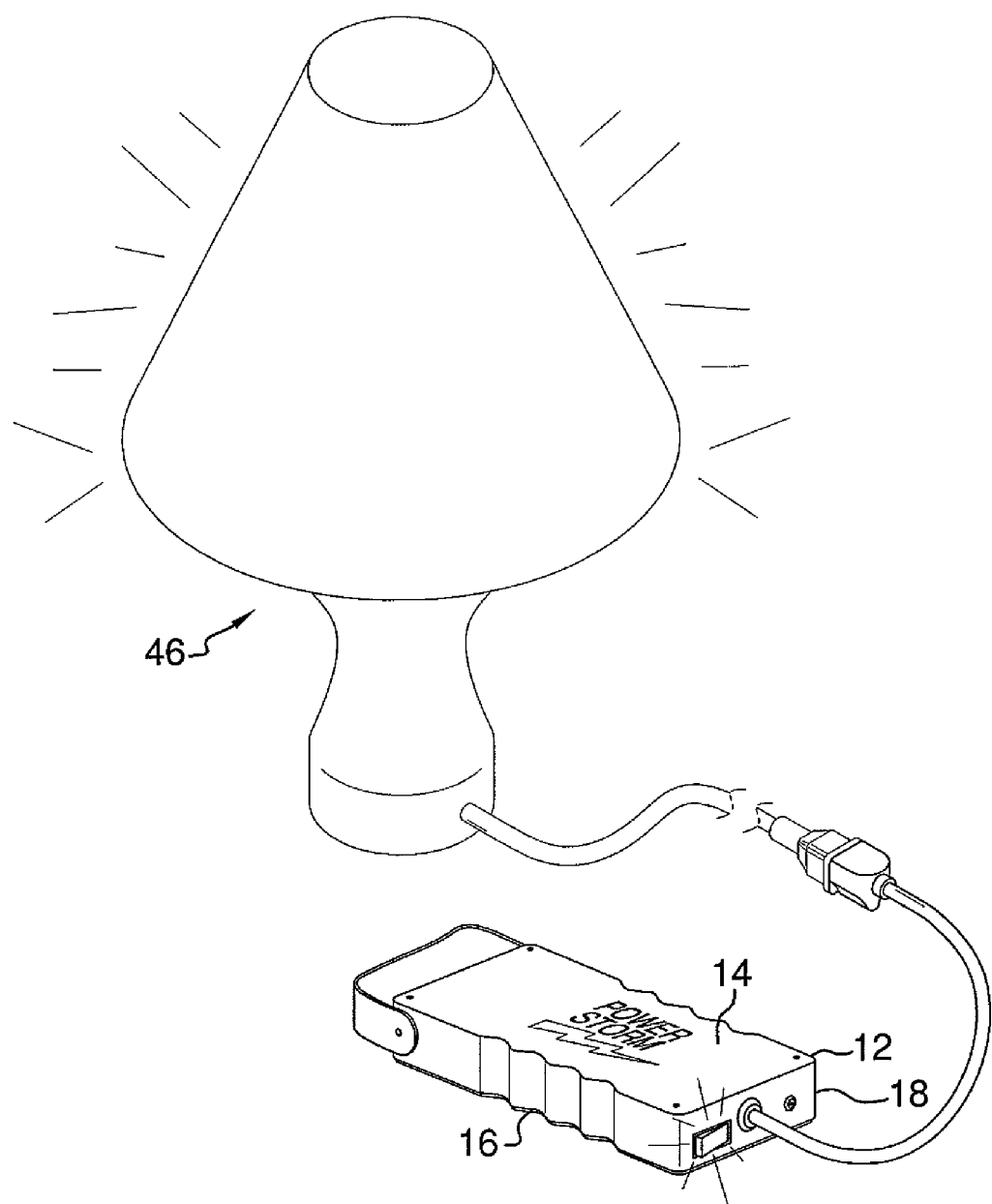
FIG. 5 is a perspective in-use view of an embodiment of the disclosure.
Figure 6:
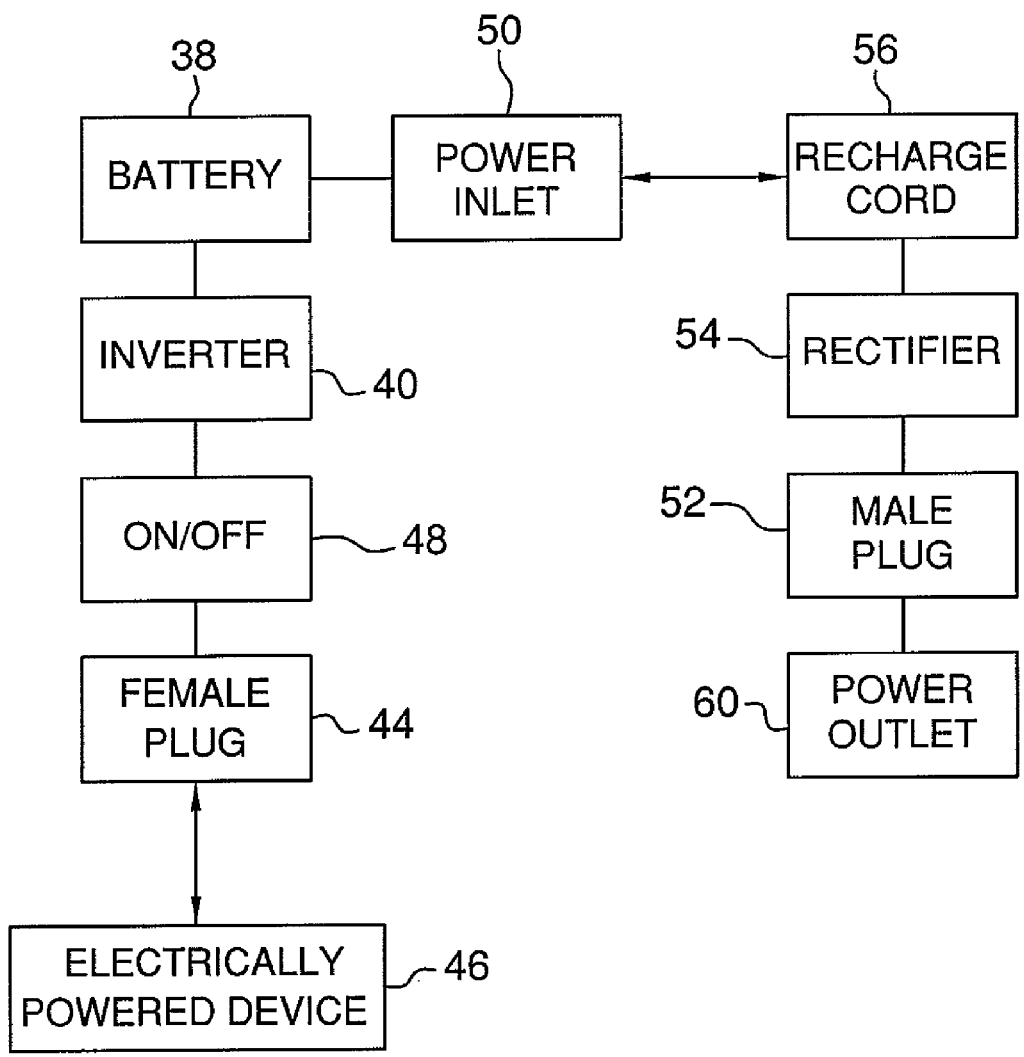
FIG. 6 is a schematic view of an embodiment of the disclosure.

With reference now to the drawings, and in particular to FIGS. 1 through 6 thereof, a new auxiliary power device embodying the principles and concepts of an embodiment of the disclosure and generally designated by the reference numeral 10 will be described.

As best illustrated in FIGS. 1 through 6, the auxiliary electrical power system 10 generally comprises a housing 12 having a top wall 14, a bottom wall 16 and a perimeter wall 18 that is attached to and extends between the top 14 and bottom 16 walls. The perimeter wall 18 includes a first end wall 20, a second end wall 22, a first lateral wall 24 and a second lateral wall 26. Each of the first 20 and second 22 lateral walls has arcuate depressions 28 therein defining finger grips. An elastomeric covering 30 is attached to and covers the bottom wall 16. A handle 32 is attached to the housing 12. The handle 32 includes a pair of legs 34 and a central member 36 that is attached to and extends between the legs 34 Each of the first 24 and second 26 lateral walls has one of the legs 34 rotatably attached thereto. The handle 32 may be comprised of an elastomeric material.

A battery 38 for storing an electric charge is mounted within the housing 12. The battery 38 may utilize greater than 50% of an interior space of the housing 12 to ensure efficient transportation and usage of the battery 38. An inverter 40 configured to convert direct current into alternating current is mounted within the housing 12 and is electrically coupled to the battery 38. A power cord 42 is electrically coupled to the inverter 40 and extends through the housing 12. The power cord 42 has a distal end with respect to the housing 12. The distal end comprises a female plug 44 configured to supply electricity to an electrically powered device 46 from the battery 38 when the electrically powered device 46 is plugged into the female plug 44.

A power actuator 48 is electrically coupled to the power cord 42. The power actuator 48 is actuated to an off position to cut electrical power to the female plug 44 from the battery 38. The power actuator 48 is actuated to an on position to provide electrical power to the female plug 44 from the battery 38. The power actuator 48 may be lighted such that it emits light when actuated to the on position.

A power inlet 50 is mounted on the housing 12 and is electrically coupled to the battery 38. A male plug 52 is electrically coupled to a rectifier 54 configured to convert alternating current to direct current. A recharge cord 56 is electrically coupled to the rectifier 54 and is pluggable into the power inlet 50 to recharge the battery 38 when the male plug 52 is plugged into a source of electricity.

In use, the battery 38 is charged by plugging the male plug 52 into a power outlet 60 and plugging the recharge cord 56 into the power inlet 50. Once the battery 38 has a charge, the power cord 42 can be plugged into an electrically powered device 46 to supply electricity from the battery 38 to the electrically powered device 46. For instance, the battery 38 may be used to power an electric light during an emergency power outage.

With respect to the above description then, it is to be realized that the optimum dimensional relationships for the parts of an embodiment enabled by the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by an embodiment of the disclosure.

Therefore, the foregoing is considered as illustrative only of the principles of the disclosure. Further, since numerous modifications and changes will readily occur to those skilled in the art, it is not desired to limit the disclosure to the exact construction and operation shown and described, and accordingly, all suitable modifications and equivalents may be resorted to, falling within the scope of the disclosure.

I claim:

1. A backup power system comprising:
   a housing having a top wall, a bottom wall and a perimeter wall being attached to and extending between said top and bottom walls;
   a battery for storing an electric charge being mounted within said housing;
   an inverter being mounted within said housing and being electrically coupled to said battery;
   a power cord being electrically coupled to said inverter and extending through said housing, said power cord having a distal end with respect to said housing, said distal end comprising a female plug configured to supply electricity to an electrically powered device from said battery when said electrically powered device is plugged into said female plug.

2. The system according to claim 1, wherein said perimeter wall includes a first end wall, a second end wall, a first lateral wall and a second lateral wall, each of said first and second lateral walls having arcuate depressions therein defining finger grips.

3. The system according to claim 2, further including an elastomeric covering being attached to and covering said bottom wall.

4. The system according to claim 3, further including a handle being attached to said housing, said handle including a pair of legs and a central member being attached to and extending between said legs, each of said first and second lateral walls having one of said legs rotatably attached thereto.

5. The system according to claim 1, further including a power actuator being electrically coupled to said power cord, said power actuator being actuated to an off position to cut electrical power to said female plug from said battery, said power actuator being actuated to an on position to provide electrical power to said female plug from said battery.

6. The system according to claim 1, further including:
   a power inlet being mounted on said housing and being electrically coupled to said battery;
   a male plug being electrically coupled to a rectifier configured to convert alternating current to direct current, a recharge cord being electrically coupled to said rectifier, said recharge cord being pluggable into said power inlet to recharge said battery when said male plug is plugged into a source of electricity.

7. A backup power system comprising:
   a housing having a top wall, a bottom wall and a perimeter wall being attached to and extending between said top and bottom walls, said perimeter wall including a first end wall, a second end wall, a first lateral wall and a second lateral wall, each of said first and second lateral walls having arcuate depressions therein defining finger grips;
   a battery for storing an electric charge being mounted within said housing, said battery filling greater than 50% of a volume of said housing;
   an inverter being mounted within said housing and being electrically coupled to said battery;
   a power cord being electrically coupled to said inverter and extending through said housing, said power cord having a distal end with respect to said housing, said distal end comprising a female plug configured to supply electricity to an electrically powered device from said battery when said electrically powered device is plugged into said female plug;
   a power actuator being electrically coupled to said power cord, said power actuator being actuated to an off position to cut electrical power to said female plug from said battery, said power actuator being actuated to an on position to provide electrical power to said female plug from said battery;
   a power inlet being mounted on said housing and being electrically coupled to said battery;
   a male plug being electrically coupled to a rectifier configured to convert alternating current to direct current, a recharge cord being electrically coupled to said rectifier, said recharge cord being pluggable into said power inlet to recharge said battery when said male plug is plugged into a source of electricity;
   an elastomeric covering being attached to and covering said bottom wall; and
   a handle being attached to said housing, said handle including a pair of legs and a central member being attached to and extending between said legs, each of said first and second lateral walls having one of said legs rotatably attached thereto.

* * * * *